US007829972B2

(12) United States Patent
Hirler et al.

(10) Patent No.: US 7,829,972 B2
(45) Date of Patent: Nov. 9, 2010

(54) EDGE TERMINATION STRUCTURE FOR SEMICONDUCTOR COMPONENTS

(75) Inventors: Franz Hirler, Isen (DE); Holger Kapels, Holzkirchen (DE)

(73) Assignee: Infineon Technologies Austria AG, Villach (AT)

( * ) Notice: Subject to any disclaimer, the term of this patent is extended or adjusted under 35 U.S.C. 154(b) by 790 days.

(21) Appl. No.: 11/683,788

(22) Filed: Mar. 8, 2007

(65) Prior Publication Data

US 2007/0210410 A1    Sep. 13, 2007

(30) Foreign Application Priority Data

Mar. 10, 2006    (DE)    ........................ 10 2006 011 567

(51) Int. Cl.
*H01L 29/00*    (2006.01)
(52) U.S. Cl. ........................ 257/513; 257/510; 438/405; 438/424
(58) Field of Classification Search ......... 257/510–513; 438/405, 424
See application file for complete search history.

(56) References Cited

U.S. PATENT DOCUMENTS

| 6,274,904 B1 | 8/2001 | Tihanyi ........................ 257/329 |
| 6,621,122 B2 | 9/2003 | Qu ............................... 257/339 |
| 6,995,426 B2 | 2/2006 | Okumura et al. | |
| 2005/0173776 A1* | 8/2005 | Dalen et al. .................. 257/483 |
| 2006/0057768 A1* | 3/2006 | Nakanishi et al. ........... 438/106 |
| 2006/0118864 A1 | 6/2006 | Hirler et al. ................. 257/335 |
| 2006/0261375 A1 | 11/2006 | Wahl et al. ................... 257/213 |

FOREIGN PATENT DOCUMENTS

| DE | 10303335 A1 | 7/2003 |
| DE | 10 2004 041 892 A1 | 3/2006 |
| DE | 10 2004 052 678 B3 | 6/2006 |
| DE | 10 2005 023 026 A1 | 11/2006 |

OTHER PUBLICATIONS

German Office Action for German Patent Application No. 10 2006 011 567.8 (3 pages), Nov. 3,2006.

* cited by examiner

*Primary Examiner*—Wael M Fahmy
*Assistant Examiner*—Tucker Wright
(74) *Attorney, Agent, or Firm*—Coats & Bennett, P.L.L.C.

(57) ABSTRACT

A semiconductor component has a drift path (4) in a semiconductor body (5) of a semiconductor chip (6). The semiconductor component has an edge area (7) and a cell area (8), which is surrounded by the edge area (7). A trench structure (9), which surrounds the semiconductor component (6) in the edge area (7), is arranged in the edge area (7) of the semiconductor component (6). At least the trench walls (10) are covered by an insulation material (11). The trench structure (9) which surrounds the semiconductor component (6) has overlapping trench zones (12) with semiconductor material (13) arranged between them.

11 Claims, 7 Drawing Sheets

EDGE TERMINATION STRUCTURE FOR SEMICONDUCTOR COMPONENTS

RELATED APPLICATION

This application claims priority from German Patent Application No. DE 10 2006 011 567.8, which was filed on Mar. 10, 2006, and is incorporated herein by reference in its entirety.

TECHNICAL FIELD

The invention relates to an edge termination structure for semiconductor components having a drift path in a semiconductor body of a semiconductor chip, as well as semiconductor parts which have at least one semiconductor component with an edge termination structure such as this. For this purpose, the semiconductor component has an edge area, and a cell area which is surrounded by the edge area.

BACKGROUND

In order to protect the cell area and in order to ensure a permissible blocking voltage for the switching structures which are arranged in the cell area, a protection electrode is arranged around the cell area in conventional semiconductor components and is at the lowest potential in the circuit during operation of the semiconductor part.

A semiconductor component having a drift path and at least one ring electrode as an edge termination is described in Patent Application DE 10 2005 023 026.1. For this purpose, not only a single ring electrode but a multiplicity of field rings of a second, complementary conductance type, are arranged as an edge termination in the edge area of a first conductance type of the semiconductor body.

The document U.S. Pat. No. 6,274,904 B1 also relates to an edge structure of a semiconductor component, with a semiconductor body of a first conductance type having an edge area with a multiplicity of areas of the complementary conductance type, which are arranged on two levels. These areas are electrically connected or capacitively coupled to one another.

Furthermore, the document U.S. Pat. No. 6,621,122 B2 discloses a termination structure in which a field ring, which is an extension of the source electrode, forms the termination at a radial center point of the termination area, with an active surface being surrounded by the termination area, which has columns of different shape of a complementary conductance type to the drift path.

Known edge termination structures such as these are intended to ensure that the breakdown voltage that is intended for that component is also achieved in the edge area. A further aim is for an edge termination structure to ensure electrical isolation between monolithically adjacent components or, in the case of components positioned in the border, electrical isolation towards an edge of the semiconductor chip.

One disadvantage of the edge termination structures described in the above documents is that the pn junctions which are arranged in the edge area have curvatures between a first and a complementary conductance type, which lead to an increase in the electrical field in the area of the curvature, and to a reduction in the breakdown voltage. Furthermore, the above structures in the form of capacitively coupled field rings, field plates and/or edge terminations with semiconductive layers occupy a large amount of space.

The disadvantage of the large amount of space that is occupied can be overcome by means of oxide-filled ring trenches, as are described in Patent Application DE 10 2004 041 892. Ring trenches such as these which surround the cell area of the semiconductor components can decrease the blocking voltage on a considerably shorter path, owing to the higher breakdown field strength of the oxide in comparison to that of silicon.

However, FIG. 7 shows the disadvantage of an oxide-filled ring trench 25 such as this if, for example, it has an adequate width b, which in this case is between 3 and 4 micrometers, with the ring trench 25 extending to a depth t of about 45 micrometers into the drift path 4 of the semiconductor body 5. With a minimal width b such as this, a hole channel 24 is formed even at 240 V on that side 23 of the oxide-filled ring trench 25 which faces away from the cell area 8, and this hole channel 24 contains the breakdown charge which is required to dissipate the electrical field, and thus prevents any further decrease in voltage in the semiconductor material.

A ring trench structure therefore has the disadvantage that it is necessary to dissipate all of the voltage in a sufficiently broad oxide-filled first ring trench 25 because the maximum voltage which can be dissipated in the situation shown in FIG. 7 is restricted to 240 V if the width of the first ring trench 25 or of the innermost ring trench 25 is not adequate. Even a plurality of oxide-filled ring trenches arranged in a stack form towards the edge do not make any additional contribution, and can therefore not increase the voltage which can be dissipated.

SUMMARY

An edge termination structure and a semiconductor component with an edge termination structure which have a trench structure may allow the space required in the edge area to be further reduced, and may ensure a higher permissible blocking voltage with a reduced trench structure width than is possible with oxide-filled ring trenches of the same width.

According to an embodiment, an edge termination structure for a semiconductor component with a drift path in a semiconductor body of a semiconductor chip, the semiconductor component may comprise an edge area and a cell area which is surrounded within the edge area, and a trench structure, which surrounds the semiconductor component in the edge area of the semiconductor component and comprising at least trench walls covered by an insulation material, wherein the trench structure which surrounds the semiconductor component comprises overlapping trench zones with semiconductor material arranged between the trench zones.

BRIEF DESCRIPTION OF THE DRAWINGS

The invention will now be explained in more detail with reference to the attached figures, in which.

DETAILED DESCRIPTION

Figure 1:
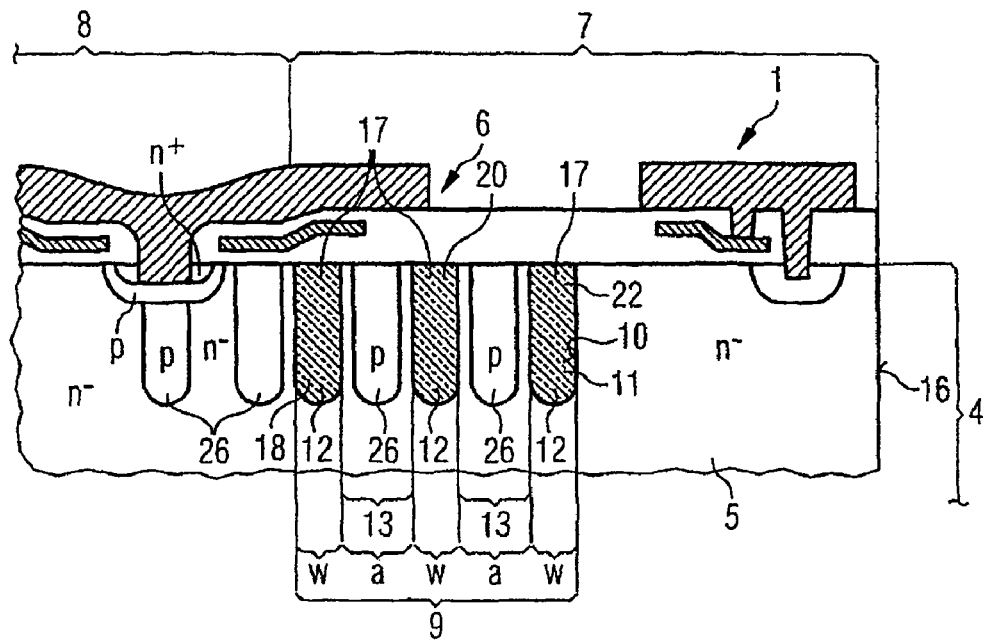
FIG. 1 shows a schematic cross section through a subarea of a semiconductor component, according to a first embodiment.

According to an embodiment, an edge termination structure is provided for semiconductor components having a drift path in a semiconductor body of a semiconductor chip, with the semiconductor component having an edge area and a cell area which is surrounded by the edge area. According to an embodiment, a trench structure which surrounds the semiconductor component in the edge area is arranged in the edge area of the semiconductor component, with at least the trench walls being covered by an insulation material. For this purpose, according to an embodiment, the trench structure which surrounds the semiconductor component in the edge area has overlapping trench zones with semiconductor material arranged between them.

In contrast to ring trenches, these trench zones may, according to an embodiment, be advantageously not in the form of a closed ring but, despite their overlap, the trench zones may have semiconductor material between them, in the form of mesa regions. According to an embodiment, it can be advantageous for the mesa region to be as long as possible from the source to the drain by "folding" between the trench zones, because this makes it possible to reduce the maximum field strength, or for the semiconductor component to cope with a higher voltage. However, according to an embodiment, care should be taken to ensure that the total charge in the semiconductor material which is arranged between the trench zones is no greater than the breakdown charge of about $1.5 \times 10^{12}$ cm$^{-2}$. According to an embodiment, the trench width can be reduced for a predetermined blocking voltage, since a plurality of trench zones can cope with the total voltage.

Furthermore, according to an embodiment, trench zones with a narrower trench width have the advantage that the filling with an insulation material can be produced at a lower cost, since the layers which have to be deposited on the walls of the trench zone and have to be oxidized on are less thick. Thus, according to an embodiment, trench widths in the region of only one micrometer are now used, instead of a trench width of 20 micrometers, for a blocking voltage of approximately 600 V. According to an embodiment, the insulation thickness to be deposited or to be oxidized on can thus be reduced by a factor of about 20, thus considerably shortening the process times.

Furthermore, oxide layers which are created on the semiconductor wafer surface during the filling of the trench structure can, according to an embodiment, additionally be structured after the introduction and oxidization of the trench structure. According to an embodiment, in the case of wet-chemical etching, this leads to structure widths and separations of at least the thickness of the oxide layers, so that thick oxide layers for broad trench zones represent a considerable disadvantage to the object of designing a space-saving edge termination.

Finally, according to an embodiment, a further advantage of the narrow trench width can be that the oxide layers which are now required cause lesser mechanical stresses in the semiconductor material than the thick insulating ring trenches required in the case of ring trenches. On the other hand, the maximum trench width of surrounding ring trenches can be restricted by the available processes, and the maximum possible blocking voltage can thus also be limited, while considerably higher blocking voltages can be achieved, with the same available process technology, with the edge termination structure according to an embodiment, in that ring trenches are no longer provided but, according to an embodiment, overlapping trench zones are provided, with semiconductor material arranged between them.

In an embodiment, the trench zones may have elongated isolation trenches in the material, which are separated from one another and overlap one another at a distance in such a manner that the semiconductor material which is arranged between the elongated isolation trenches has no straight connection which extends from the edge area orthogonally to the cell area of the semiconductor component.

This embodiment has the advantage that the semiconductor material path length between the trench zones is lengthened, thus making it possible for the semiconductor material arranged between them to cope with a higher voltage.

In a further embodiment, the elongated isolation trenches are at an acute angle in their longitudinal extent to the border edge of the semiconductor component, in such a manner that the semiconductor material which is arranged between the elongated isolation trenches has no straight connection which extends from the edge area orthogonally to the cell area of the semiconductor component. The more acute this angle is, according to some embodiments, the longer is the path length of semiconductor material which is arranged between the trench zones, and thus the greater the extent to which the maximum field strength can be reduced towards the edge.

In a further embodiment, instead of the elongated isolation trenches, isolation columns are incorporated as trench zones in the drift path, with the isolation columns being arranged in a plurality of rows in the edge area. According to an embodiment, the isolation columns can be arranged offset with respect to one another in the rows, in such a manner that the semiconductor material which is arranged between the isolation columns has no straight connection which extends from the edge area orthogonally to the cell area of the semiconductor component. According to an embodiment, the offset arrangement of the isolation columns in the rows results in a mesa region composed of semiconductor material, which has a meandering or folded profile from the edge towards the cell area. In this case as well, this may considerably lengthen the path length of the semiconductor material, so that an effect corresponding to that of the offset elongated isolation zones can also be achieved with isolation columns in a suitable offset arrangement.

According to an embodiment, the distance between the isolation columns may be varied from the cell area in the direction of the border edge of the semiconductor component. According to an embodiment, this distance between the isolation columns advantageously may increase from the cell area in the direction of the border edge of the semiconductor component. The same effect can be achieved, according to an embodiment, if the clearance between the isolation columns decreases from the cell area in the direction of the border edge of the semiconductor component, with the step width between the trench zones being constant. This likewise means that the distance to the border edge increases.

However, in one embodiment, the distance between the trench zones may be constant, with the clearance remaining constant. This has the advantage that a simple and low-cost design can be used as the basis of the mask technique.

In one embodiment, the clearance between the trench zones can be less by up to 1 order of magnitude than in trench structures of conventional edge terminations. This may have the advantages that have already been described above, and in this case the thickness of the isolation layer is also considerably decreased, thus allowing considerably smaller, and more filigree structures on the upper face of the semiconductor component in the edge area, when using wet etching for structuring purposes.

Provision can also be made for the trench zones to be completely filled with insulation material, according to an embodiment. On the other hand, according to an embodiment, it is also sufficient just to fill the trench walls with an insulation material, while the rest of the trench volume is filled with polycrystalline silicon. This has the advantage that the polycrystalline silicon can be at the lowest electrical potential during operation of the semiconductor component, thus making it possible to introduce an additional potential threshold into the edge structure.

It may be particularly advantageous, according to an embodiment, for the trench zones to have an oxide of the semiconductor material as the insulation material, not least because then only thermal oxidation of the semiconductor material, in particular composed of silicon, is required in order to produce these insulated trench walls. This does not apply to semiconductor materials which form volatile oxides. A further option, according to an embodiment, is to fill the trench zones with an insulation material composed of an amorphous carbon, which is doped with hydrogen.

Silicon or silicon carbide, or III-V semiconductor material, preferably semi-insulating gallium-indium arsenide, can be preferably used as semiconductor materials for the semiconductor body or the semiconductor component, according to an embodiment. The type of semiconductor material depends on what characteristics of the semiconductor material, such as mobility of the charge carriers and diffusion length of the charge carriers, are advantageous for a corresponding semiconductor component with a drift path. An edge termination structure such as this is preferably used for semiconductor components such as a PN⁻N-diode, a Schottky diode, an insulated-gate bipolar transistor (IGBT) or a field-effect transistor. A semiconductor part may also have a plurality of semiconductor components with the edge covering structure according to an embodiment.

Figure 2:
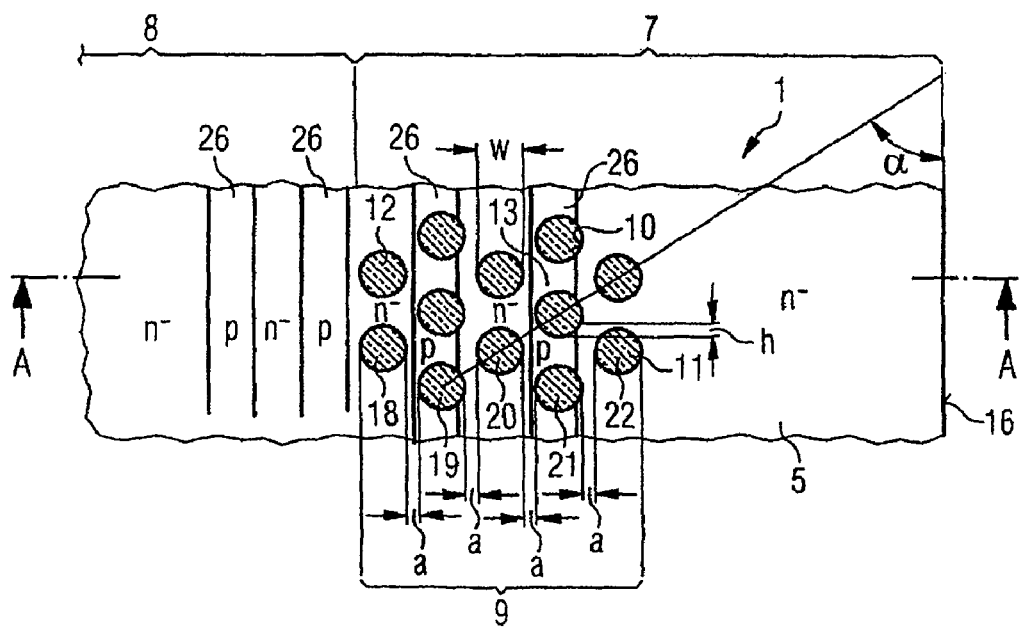
FIG. 2 shows a schematic plan view of the subarea of the semiconductor component shown in FIG. 1.

FIG. 1 shows a schematic cross section along the section A-A in FIG. 2, through a subarea of a semiconductor component with an edge termination structure 1, according to a first embodiment. For this purpose, the semiconductor component has a semiconductor body 5, which has a drift path 4. The semiconductor body 4 has an edge area 7, which surrounds a cell area 8 of a semiconductor component 6. Charge compensation zones 26 are arranged in the drift path 4 within the edge area 7 and are of a conductance type p which is complementary to the conductance type n of the drift path 4.

Figure 8:
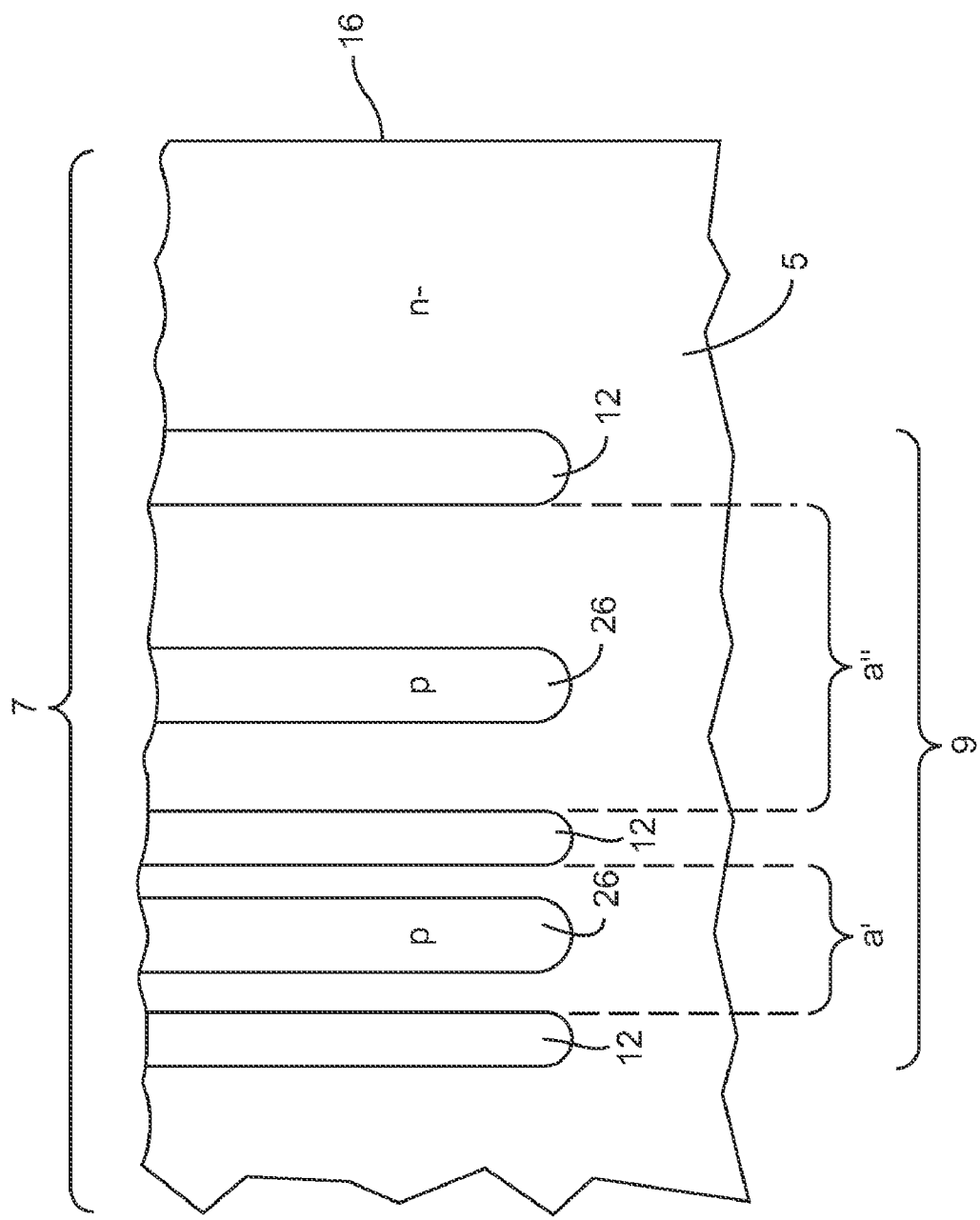
FIG. 8 shows a schematic cross section view of the edge area of the semiconductor component shown in FIG. 1.

Furthermore, isolation columns 17 are arranged in three rows 18, 20 and 22 in this section A-A in the edge area 7, with these rows 18, 20 and 22 surrounding the cell area 8. The isolation columns 18, 20 and 22 in this embodiment are filled with silicon oxide as insulation material 11, with the insulation material 11 also covering the trench walls 10 of the trench structure 9. Semiconductor material 13 is arranged between the trench zones 12 in the form of isolation columns 17, with the distance a between the isolation columns 17, which have a clearance w, increasing towards the border edge 16 of the semiconductor body 5, e.g., as shown in FIG. 8 where the distance a" between the outermost and second outermost trench zones 12 is greater than the distance a' between the second and third outermost trench zones 12. While the charge compensation zones 26 are arranged at equal distances, the distance a between the isolation columns 18, 20 and 22 varies.

FIG. 2 shows a schematic plan view of the subarea of the semiconductor component 1 shown in FIG. 1. While the charge compensation zones 26 are arranged in the form of strips, the isolation columns 17 of the trench structure 9 are arranged in rows 18, 19, 20, 21 and 22, with the individual isolation columns 17 in the rows 18 to 22 being positioned offset with respect to one another, in such a manner that the semiconductor material 13 which is arranged in between them has no straight orthogonal connection between the border edge 16 and the cell area 8. In fact, the isolation columns 17 are arranged such that they overlap and have an overlap h, so that the mesa region between the isolation columns 17 has a meandering shape, thus allowing a longer path length, and thus a reduced field strength, between the cell area 8 and the border edge 16.

In this case, the isolation columns 17, which are arranged offset, form an acute angle α with the border edge 16, which at the same time is the angle of the semiconductor path between the isolation columns 17. While FIG. 1 forms the cross section along the section A-A in FIG. 2, both the charge compensation zones 26, which are in the form of strips, and the isolation columns 17 of the trench structure 19 can be seen in the edge area 7 in FIG. 1, while the distance a on the section plane A-A between the trench zones is considerably greater than the distance a between the trench zones as illustrated in FIG. 2.

Figure 3:
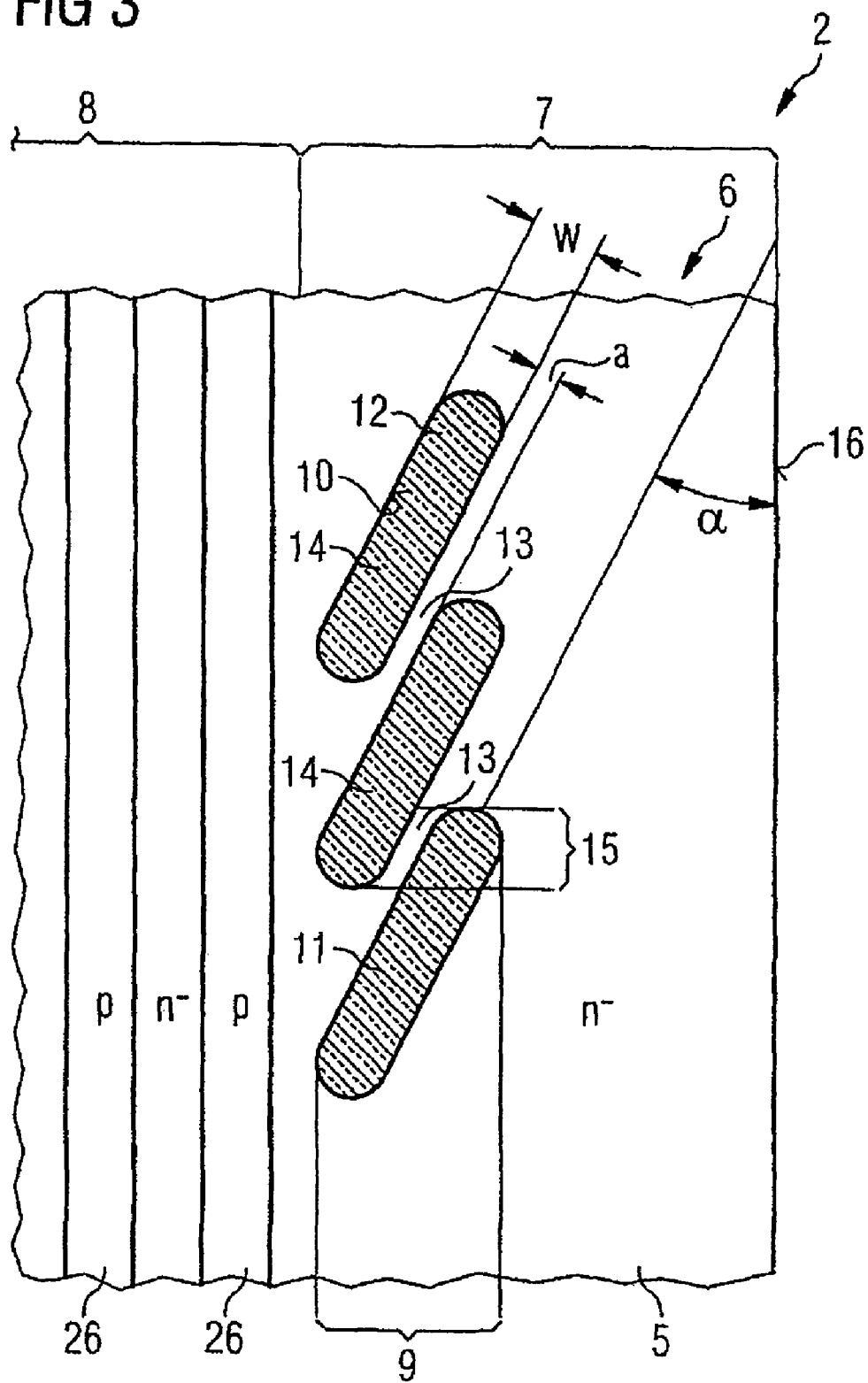
FIG. 3 shows a schematic plan view of a subarea of the semiconductor component, according to a second embodiment.

FIG. 3 shows a schematic plan view of a subarea of a semiconductor component with an edge termination structure 2, according to a second embodiment. In this case, elongated isolation trenches 14 are arranged in an overlapping form as trench zones 12 adjacent to the cell area 8 in the edge area 7, with the overlap 15 being greater than the overlap h in the first embodiment as shown in FIG. 2. The acute angle α in an arrangement of elongated trench zones 12 such as this can also be made smaller than in the embodiment shown in FIG. 1 or FIG. 2. The trench width b is in the range $0.1\ \mu m \leq b \leq 2\ \mu m$, in micrometers, while the length l in micrometers of the elongated isolation trenches 14 may be between $1\ \mu m \leq l \leq 60\ \mu m$. The semiconductor material 13 between the trench zones 12 is likewise arranged at an acute angle α to the border edge 16, thus lengthening the path through the semiconductor material considerably in comparison to a direct straight connection between the cell area 8 and the border edge 16.

Figure 4:
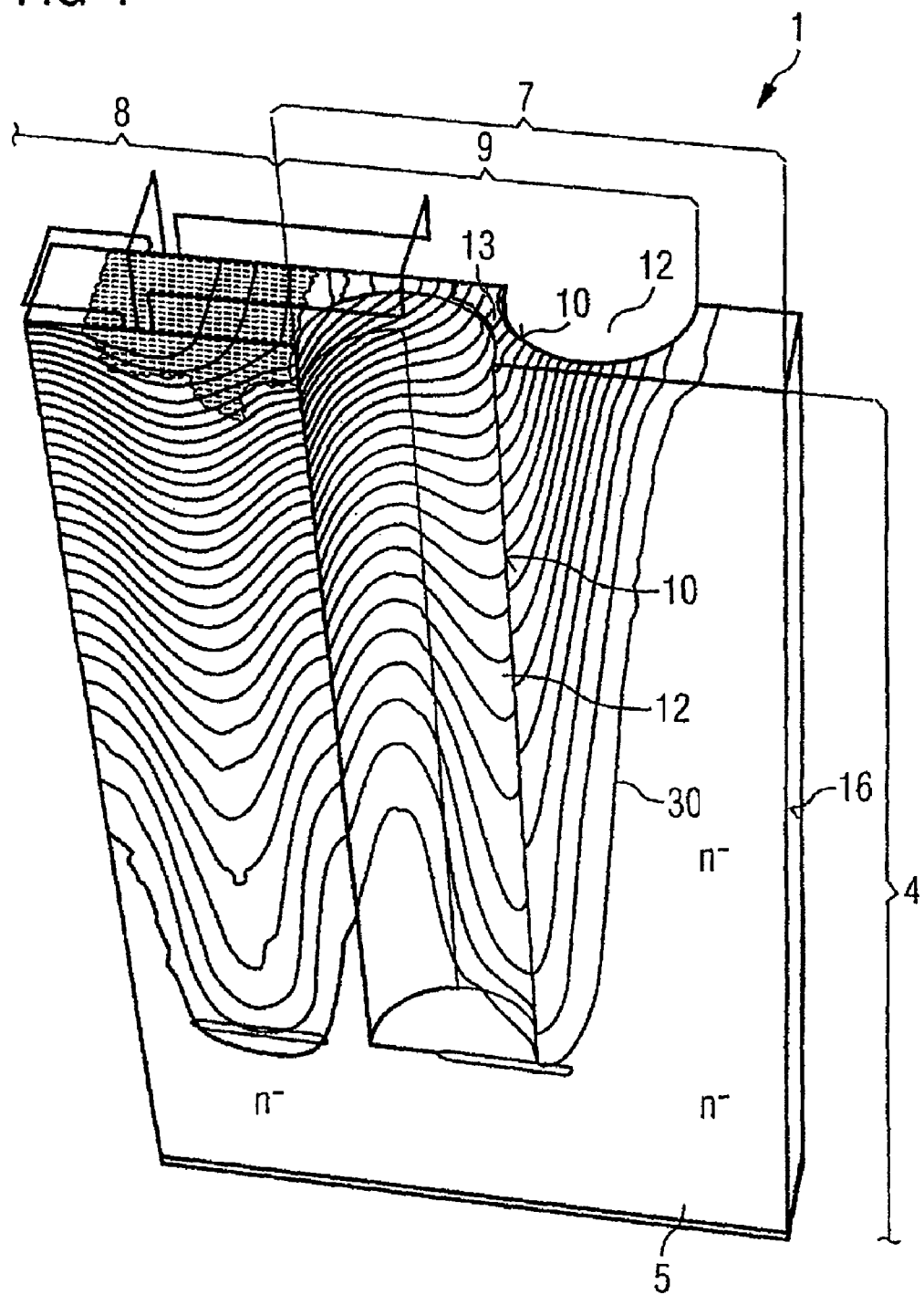
FIG. 4 shows a schematic, perspective view of a subarea of the semiconductor part as shown in FIG. 1, without trench filling with equipotential lines.
Figure 7:
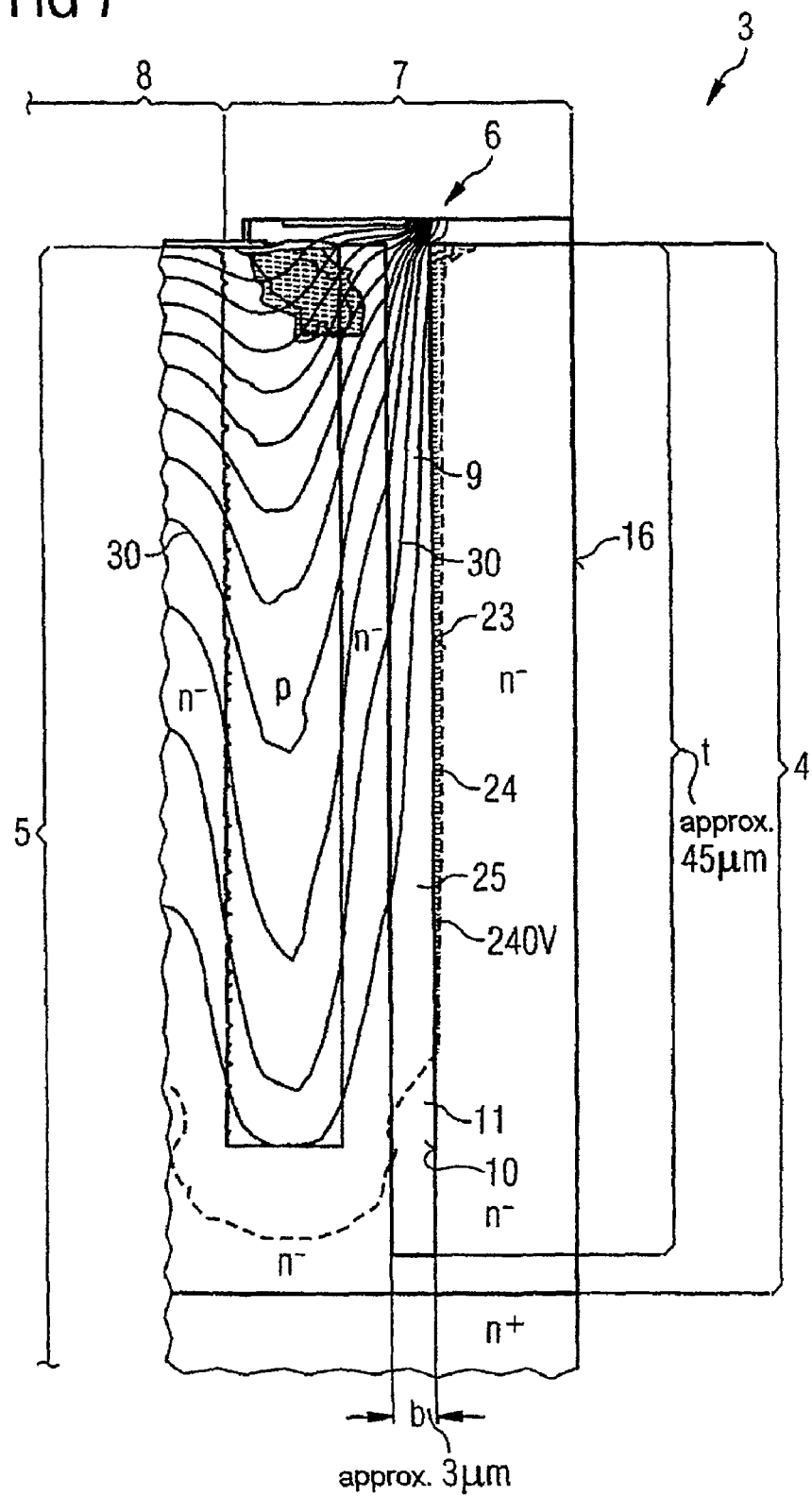
FIG. 7 shows a schematic cross section through a subarea of a semiconductor component according to a previous patent application, with ring trenches.

FIG. 4 shows a schematic, perspective view of a subarea of the semiconductor part with an edge termination structure 1 as shown in FIG. 1, without trench filling, and with equipotential lines 30. As can clearly be seen in this case, the equipotential lines 30 can extend further in the semiconductor material 13 than in the prior art, as shown in FIG. 7. It is thus possible to allow considerably higher blocking voltages with this design of the edge termination.

Figure 5:
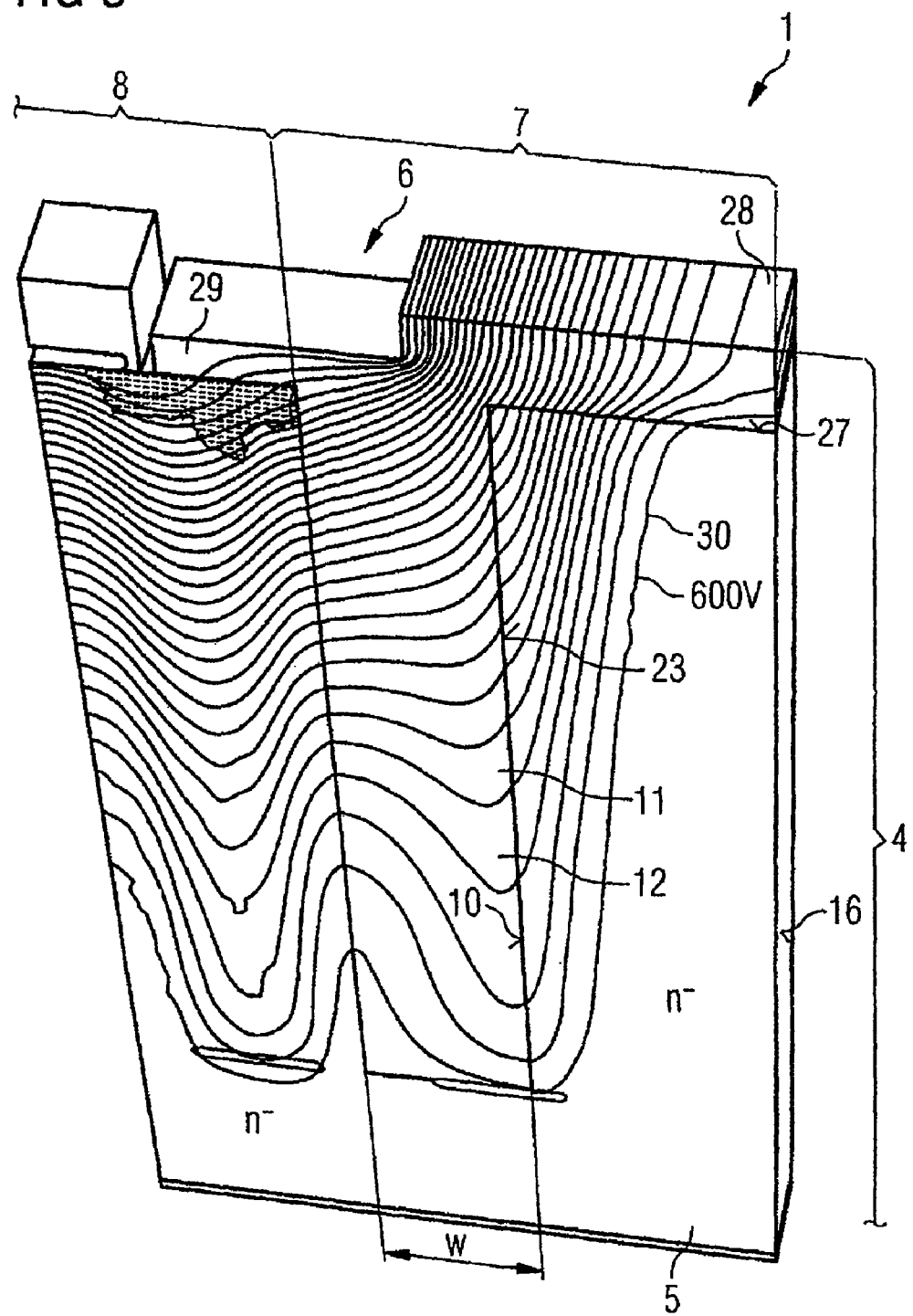
FIG. 5 shows a schematic, perspective view of the subarea of the semiconductor component as shown in FIG. 4, with trench filling and with equipotential lines.

FIG. 5 shows a schematic, perspective view of the subarea of the semiconductor component with an edge termination structure 1 as shown in FIG. 4, with trench filling and with equipotential lines 30. In this case, the trench filling is an insulating material 11, which is created by thermal oxidation of the semiconductor material. The equipotential lines 30 extend well beyond the edge side 23 of the trench zone 12, which faces away from the cell area 7, so that, in contrast to the prior art, an indefinitely high blocking voltage can be achieved, even though the clearance w is less by at least one order of magnitude than the trench width of ring trenches as known from the patent application cited above. In this illustration, equipotential lines 30 are also shown in the oxide layer 28, which is arranged on the upper face 27 of the semiconductor body 4, and the field-oxide layer 29.

Figure 6:
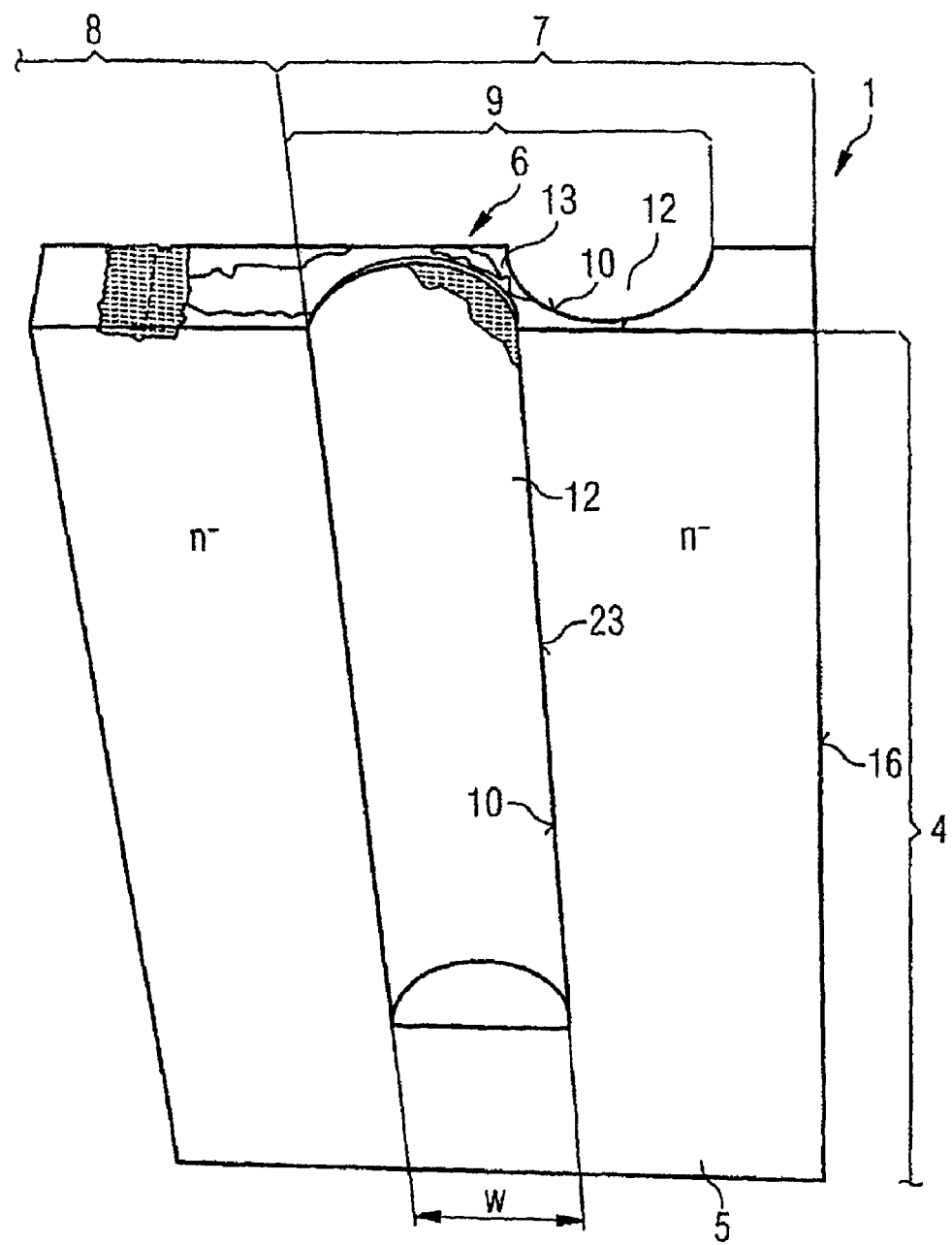
FIG. 6 shows a schematic, perspective view of the subarea of the semiconductor component shown in FIG. 4 with a hole concentration distribution.

FIG. 6 shows a schematic, perspective view of the subarea of the semiconductor component with the edge termination structure 1 as shown in FIG. 4, and with a hole concentration distribution. This drawing clearly shows that it has not been possible to produce any hole channel on the side 23 of the trench zone 12 facing away from the cell area 8. In fact, the holes are concentrated with a high concentration on the body zone in the cell area of the semiconductor chip.

FIG. 7 shows a schematic cross section through a subarea of a semiconductor component with an edge termination structure 3, according to a previous patent application, with ring trenches 25. FIG. 7 has already been discussed in the introduction to the description, so that FIG. 7 will not be described again, in order to avoid repetition.

LIST OF REFERENCE SYMBOLS

1 Edge termination structure ($1^{st}$ embodiment)
2 Edge termination structure ($2^{nd}$ embodiment)
3 Edge termination structure (earlier patent application)
4 Drift path
5 Semiconductor body
6 Semiconductor component
7 Edge area
8 Cell area
9 Trench structure
10 Trench wall
11 Insulation material
12 Trench zone
13 Semiconductor material
14 Elongated isolation trench
15 Overlap
16 Border edge
17 Isolation column
18 Row of isolation columns
19 Row of isolation columns
20 Row of isolation columns
21 Row of isolation columns
22 Row of isolation columns
23 Averted side of the trench zone
24 Hole channel
25 Ring trench
26 Charge compensation zone
27 Upper face
28 Oxide layer
29 Field-oxide layer
30 Equipotential line
a Distance between rows of isolation columns
b Width of a trench structure
h Overlap
s Step width
w Clearance
α Acute angle

What is claimed is:

1. An edge termination structure for a semiconductor component with a drift path in a semiconductor body of a semiconductor chip, the semiconductor component comprising:
    an edge area and a cell area which is surrounded within the edge area, and
    a trench structure, which surrounds the semiconductor component in the edge area of the semiconductor component and comprising at least trench walls covered by an insulation material, wherein the trench structure which surrounds the semiconductor component comprises overlapping trench zones with semiconductor material arranged between the trench zones, the distance between the trench zones increasing from the cell area in the direction of the border edge of the semiconductor component.

2. The edge termination structure according to claim 1, wherein the trench zones have elongated isolation trenches in the material of the drift path, which are separated from one another and overlap one another at a distance in such a manner that the semiconductor material which is arranged between the elongated isolation trenches has no straight connection which extends from the edge area orthogonally to the cell area of the semiconductor component.

3. The edge termination structure according to claim 1, wherein the trench zones have elongated isolation trenches in the material of the drift path, which are separated from one another and overlap one another at a distance, and with their longitudinal extent being at an acute angle to the border edge of the semiconductor component, in such a manner that the semiconductor material which is arranged between the elongated isolation trenches has no straight connection which extends from the edge area orthogonally to the cell area of the semiconductor component.

4. The edge termination structure according to claim 1, wherein the trench zones have isolation columns which are arranged in a plurality of rows in the edge area, with the isolation columns in the rows being arranged offset with respect to one another, in such a manner that the semiconductor material which is arranged between the isolation columns has no straight connection which extends from the edge area orthogonally to the cell area of the semiconductor component.

5. The edge termination structure according to claim 1, wherein the clearance between the trench zones is less by up to 1 order of magnitude than trench structures of conventional edge terminations.

6. The edge termination structure according to claim 1, wherein the trench zones are completely filled with insulation material.

7. The edge termination structure according to claim 1, wherein the trench zones have a trench filling which has a polycrystalline silicon on the insulation material of the trench walls.

8. The edge termination structure according to claim 1, wherein the trench zones have an oxide of the semiconductor material as insulation material.

9. The edge termination structure according to claim 1, wherein the trench zones have an amorphous carbon, which is doped with hydrogen, as the insulation material.

10. The edge termination structure according to claim 1, wherein the semiconductor component has silicon, silicon carbide or a III-V semiconductor material, preferably semi-insulating gallium indium arsenide, as the semiconductor material.

11. The edge termination structure according to claim 1, wherein charge compensation zones are arranged between the trench zones.

* * * * *